(12) United States Patent
Kim et al.

(10) Patent No.: US 7,622,962 B2
(45) Date of Patent: Nov. 24, 2009

(54) SENSE AMPLIFIER CONTROL SIGNAL GENERATING CIRCUIT OF SEMICONDUCTOR MEMORY APPARATUS

(75) Inventors: Dae-Suk Kim, Gyeonggi-Do (KR); Jong Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 117 days.

(21) Appl. No.: 11/826,924

(22) Filed: Jul. 19, 2007

(65) Prior Publication Data
US 2008/0136484 A1   Jun. 12, 2008

(30) Foreign Application Priority Data
Dec. 7, 2006   (KR) ............... 10-2006-0123585

(51) Int. Cl.
*G01R 19/00* (2006.01)
(52) U.S. Cl. ............................................. 327/51
(58) Field of Classification Search ............... 327/51, 327/52, 53, 54, 55, 56, 57
See application file for complete search history.

(56) References Cited
U.S. PATENT DOCUMENTS

| | | | |
|---|---|---|---|
| 5,966,337 A | 10/1999 | Lee et al. | |
| 6,043,685 A | 3/2000 | Lee | |
| 6,097,653 A | 8/2000 | Park | |
| 6,347,058 B1 | 2/2002 | Houghton et al. | |
| 6,977,530 B1 * | 12/2005 | Wang et al. | 327/51 |
| 7,126,408 B2 * | 10/2006 | Zerbe | 327/336 |
| 7,158,430 B2 * | 1/2007 | Byun | 365/205 |

FOREIGN PATENT DOCUMENTS

| | | |
|---|---|---|
| JP | 10340583 | 12/1998 |
| KR | 10-1999-0062409 | 7/1999 |

* cited by examiner

*Primary Examiner*—Jeffrey S Zweizig
(74) *Attorney, Agent, or Firm*—Venable LLP; Jeffri A. Kaminski

(57) ABSTRACT

A sense amplifier control signal generating circuit of a semiconductor memory apparatus is provided. The sense amplifier control signal generating circuit includes a timing control unit that models a transmission path of data from a memory cell to a sense amplifier through a bit line and generates a timing control signal at a sensing timing when the sense amplifier starts a sensing operation. A sense amplifier control signal generating unit receives the timing control signal and generates a sense amplifier control signal.

11 Claims, 3 Drawing Sheets

SENSE AMPLIFIER CONTROL SIGNAL GENERATING CIRCUIT OF SEMICONDUCTOR MEMORY APPARATUS

CROSS-REFERENCE TO RELATED PATENT APPLICATION

This application claims the benefit of Korean Patent Application No. 10-2006-0123585, filed on Dec. 7, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a sense amplifier control signal generating circuit of a semiconductor memory apparatus.

2. Related Art

Semiconductor memory apparatuses may include memory cells having capacitors, bit lines for transmitting data of the memory cells, and a sense amplifier for sensing the data transmitted through the bit lines.

The capacitor stores a low or high potential according to the data transmitted through the bit lines, and information stored in the capacitor is transmitted to the sense amplifier through the bit lines. Then, the sense amplifier amplifies the transmitted information.

For example, when high-level information is stored in the capacitor, the high-level information stored in the capacitor is transmitted to the sense amplifier through a pair of bit lines including of a bit line and a bit line bar. When no data is transmitted, the bit line and the bit line bar are always pre-charged with a bit line pre-charge voltage VBLP. Therefore, the high-level information output from the capacitor is applied to the bit line, and the bit line bar is maintained at the bit line pre-charge voltage VBLP.

The sense amplifier amplifies a potential difference between the bit line and the bit line bar. The potential difference between the bit line and the bit line bar should be higher than a predetermined level so as to perform a sensing operation of the sense amplifier.

The sense amplifier starts the sensing operation when a predetermined amount of time has elapsed after data is transmitted through the bit line. The sense amplifier performs the sensing operation in response to a sense amplifier control signal for driving the sense amplifier.

As shown in FIG. 1, a sense amplifier control signal generation circuit according to the related art may include a delay unit 10 that delays an active signal ACT and a sense amplifier control signal generating unit 20 that generates a sense amplifier control signal Senamp_ctrl for driving the sense amplifier in response to an output signal of the delay unit 10. The sense amplifier control signal Senamp_ctrl includes a pull-up signal and a pull-down signal.

Such a conventional sense amplifier is driven after elapse of the delay time when the sense amplifier control signal Senamp_ctrl is generated.

However, the sense amplifier is not operated immediately after a potential difference for allowing the sense amplifier to perform a normal sensing operation due to the delay unit. Therefore, a time tRCD required to start a reading or writing operation after an active command is received is increased. As a result, a response speed the semiconductor memory apparatus is lowered.

SUMMARY OF THE INVENTION

An embodiment of the present invention provides a sense amplifier control signal generating circuit of a semiconductor memory apparatus capable of operating a sense amplifier immediately after a potential difference between a pair of bit lines.

According to an embodiment of the invention, there is provided a sense amplifier control signal generating circuit of a semiconductor memory apparatus. The sense amplifier control signal generating circuit includes: a timing control unit that models a transmission path of data from a memory cell to a sense amplifier through a bit line to generate a timing control signal at a sensing timing when the sense amplifier starts a sensing operation; and a sense amplifier control signal generating unit that receives the timing control signal to generate a sense amplifier control signal.

DESCRIPTION OF EXEMPLARY EMBODIMENT

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
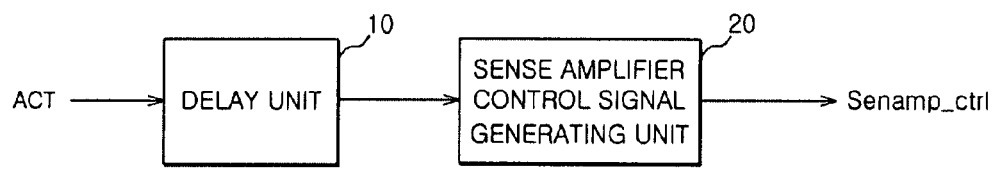
FIG. 1 is a block diagram illustrating a sense amplifier control signal generating circuit of a semiconductor memory apparatus according to the related art.
Figure 2:
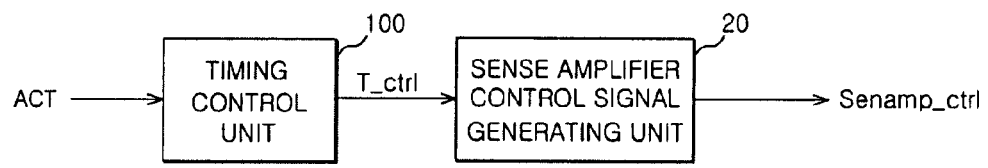
FIG. 2 is a detailed circuit diagram illustrating a sense amplifier control signal generating circuit of a semiconductor memory apparatus according to an embodiment of the present invention.

Referring to FIG. 2, a sense amplifier control signal generating circuit of a semiconductor memory apparatus may include a timing control unit 100 and a sense amplifier control signal generating unit 20.

The timing control unit 100 generates a timing control signal T_ctrl at a sensing time when a voltage difference to enable a sense amplifier to perform a normal sensing operation is generated. The timing control signal T_ctrl is generated by modeling memory cells, bit lines, and the sense amplifier. Particularly, the timing control signal T_ctrl is obtained by modeling a transmission path of data from a memory cell to a sense amplifier through the bit line. The voltage difference for the normal sensing operation of the sense amplifier may be a difference between a pre-charged bit line bar voltage and a capacitor voltage applied to a bit line voltage. A predetermined amount of time may be required to completely apply the capacitor voltage to the bit line.

Figure 3:
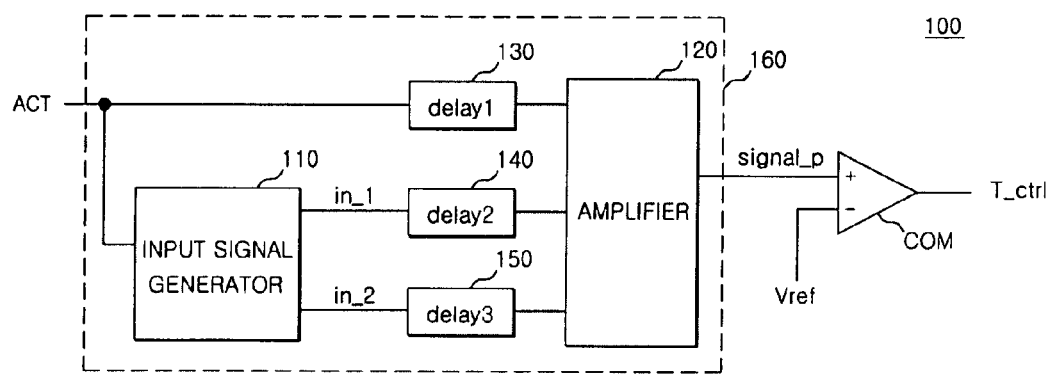
FIG. 3 is a circuit diagram illustrating a timing control unit shown in FIG. 2.

More specifically, as shown in FIG. 3, the timing control unit 100 may include a signal amplifier 160 and a comparator com.

The signal amplifier 160 substantially models the memory cells, the bit lines, and the sense amplifier to generate an amplified signal signal_p. The signal amplifier 160 may include an input signal generator 110, first to third delays delay1, delay2, and delay3, and an amplifier 120. The first delay delay1 models the time between an enabling time of an active signal ACT and an operational starting time of the sense amplifier. The input signal generator 110 may model a memory cell, and the second and third delays delay2 and delay3 may model the data transmission time from the memory cell to the sense amplifier. The amplifier 120 may model the sense amplifier.

That is, the first delay delay1 delays the active signal ACT, and the input signal generator 110 generates first and second input signals in_1 and in_2. The second delay delay2 delays the first input signal in_1, and the third delay delay3 delays the second input signal in_2. The amplifier 120 is driven by an output signal of the first delay delay1, and amplifies output signals of the second and third delays delay2 and delay3 to generate the amplified signal signal_p. The amplifier 120 may have the same structure as the sense amplifier.

Figure 4:
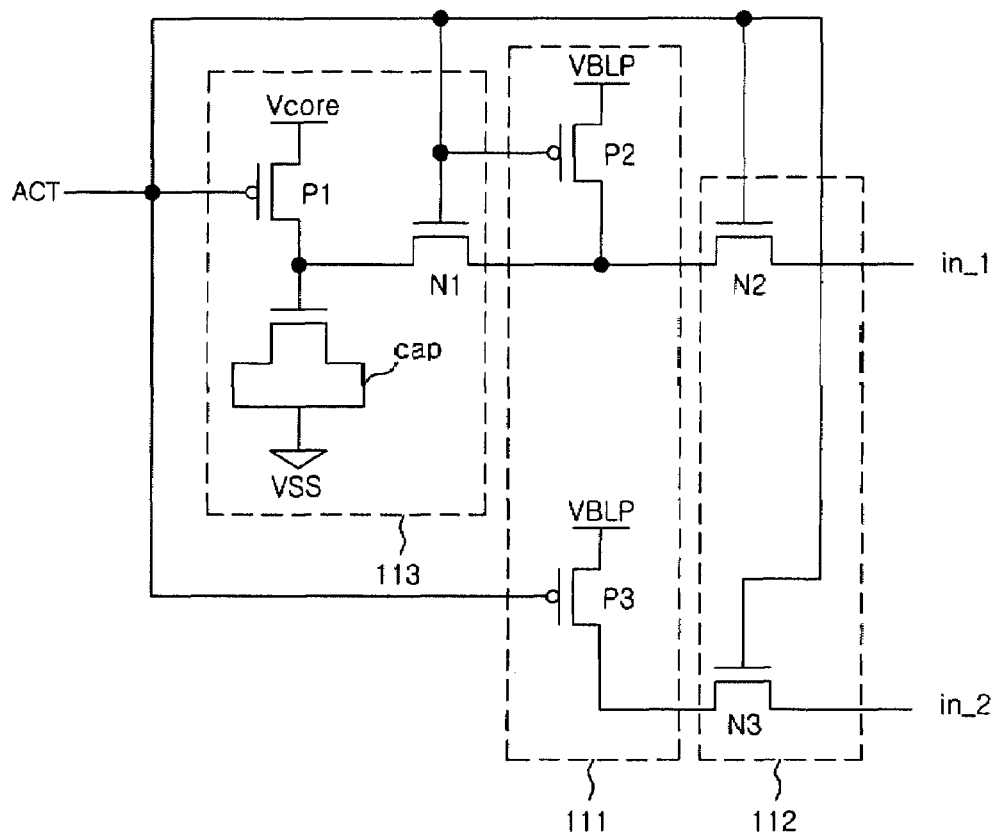
FIG. 4 is a circuit diagram illustrating an input signal generator shown in FIG. 3.

Referring to FIG. 4, the input signal generator 110 may include a first switching unit 111, a second switching unit 112, and a voltage applying unit 113.

The first switching unit 111 is turned on in response to the active signal ACT to output a bit line pre-charge voltage VBLP. The first switching unit 111 may include a third transistor P2 and a fourth transistor P3. The third transistor P2 has a gate to which the active signal ACT is input, a source supplied with the bit line pre-charge voltage VBLP, and a drain connected to an output terminal of the voltage applying unit 113. The fourth transistor P3 has a gate to which the active signal ACT is input and a source supplied with the bit line pre-charge voltage VBLP.

The second switching unit 112 outputs a voltage obtained by adding the bit-line pre-charge voltage to the stored voltage as the first input signal in response to the active signal, and outputs the bit line pre-charge voltage as the second input signal. The second switching unit 112 may include a fifth transistor N2 and a sixth transistor N3. The fifth transistor N2 has a gate to which the active signal ACT is input, a drain connected to the drain of the third transistor P2, and a source that outputs the first input signal in_1. The sixth transistor N3 has a gate to which the active signal ACT is input, a drain connected to the drain of the fourth transistor P3, and a source that outputs the second input signal in_2. The voltage applying unit 113 applies a core voltage to a capacitor or outputs a voltage stored in the capacitor in response to the active signal. The voltage applying unit 113 may include a first transistor P1, a capacitor cap, and a second transistor N1. The first transistor P1 has a gate to which the active signal ACT is input and a source supplied with a core voltage Vcore. The capacitor cap is connected between the first transistor P1 and a ground terminal. The second transistor N1 has a gate to which the active signal ACT is input, a drain connected to a node between the first transistor P1 and the capacitor cap, and a source serving as an output terminal of the voltage applying unit 113. The voltage applying unit 113 having the above-mentioned structure stores the core voltage Vcore in the capacitor cap when the active signal ACT is disabled at a low level, and outputs the voltage stored in the capacitor cap when the active signal ACT is enabled at a high level. The core voltage Vcore may be actually applied to the memory cell. At that time, the first switching unit 111 and the second switching unit 112 may be driven at different timings in response to the active signal.

The comparator com compares the potential level of the amplified signal signal_p with the level of a reference voltage Vref, to generate the timing control signal T_ctrl. The potential level of the amplified signal signal_p may be higher than the level of the bit line pre-charge voltage VBLP.

Referring to FIG. 2 again, the sense amplifier control signal generating unit 20 receives the timing control signal T_ctrl to generate a sense amplifier control signal Senamp_ctrl. The sense amplifier control signal Senamp_ctrl may include a pull-up signal and a pull-down signal for controlling the operation of the sense amplifier.

Figure 5:
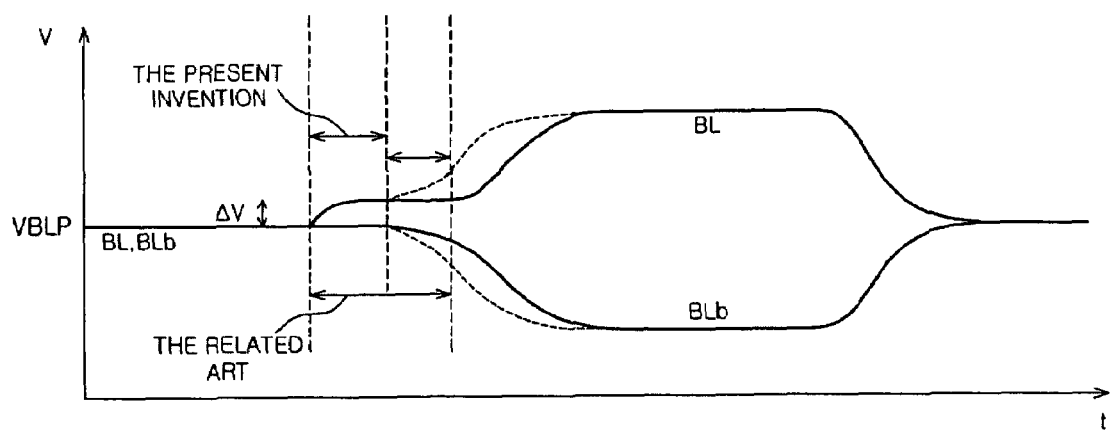
FIG. 5 is a graph illustrating a bit line sensing operation of a semiconductor memory apparatus including the sense amplifier control signal generating circuit according to an embodiment of the present invention.

Referring to FIG. 5, in the sense amplifier control signal generating circuit, when the active signal ACT is disabled at a low level, the core voltage Vcore is charged to the capacitor cap, and the first switching unit 111 is turned on, so that a node between the voltage applying unit 113 and the second switching unit 112 is pre-charged with the bit line pre-charge voltage VBLP.

Meanwhile, when the active signal ACT is enabled at a high level, the first switching unit 111 is turned off, and the second switching unit 112 is turned on. The voltage stored in the capacitor cap of the voltage applying unit 113 is output through the second transistor N1.

Thus, when the voltage stored in the capacitor cap is applied to the node that is pre-charged with the bit line pre-charge voltage VBLP, the potential level of the first input signal in_1 increases. The bit line pre-charge voltage VBLP is output as the second input signal in_2.

The amplifier 120 receives the first input signal in_1 and the second input signal in_2, to amplify a potential difference between the two signals. The amplifier 120 may output only an amplified first input signal in_1 as the amplified signal signal_p.

The comparator com compares the amplified signal signal_p with the reference voltage Vref, to generate a timing control signal T_ctrl that is enabled at a high level when the level of the reference voltage Vref is higher than the level of the amplified signal signal_p. The reference voltage Vref has a level VBLP+$\Delta$V obtained by adding the bit line pre-charge voltage VBLP to a voltage difference $\Delta$V for allowing the sense amplifier to perform a normal sensing operation.

According to an embodiment, the sense amplifier control signal generating circuit of the semiconductor memory apparatus models a data sensing operation to generate a sense amplifier control signal. According to when a voltage difference for enabling the sense amplifier to perform a normal data sensing operation is generated, the sense amplifier can immediately perform the sensing operation.

In the semiconductor memory apparatus including the sense amplifier control signal generating circuit according to an embodiment of the invention, the timing when the sense amplifier performs a sensing operation is earlier than that of the semiconductor memory apparatus according to the related art, which makes it possible to improve the response speed of a semiconductor memory apparatus.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A sense amplifier control signal generating circuit of a semiconductor memory apparatus, the sense amplifier control signal generating circuit comprising:
a timing control unit configured to receive an active signals, detect whether a voltage difference between a bit line and a bit line bar is a value to enable a sense amplifier and to generate a timing control signal at a sensing timing when the voltage difference reaches the value; and
a sense amplifier control signal generating unit configured to receive the timing control signal to generate a sense amplifier control signal.

2. The sense amplifier control signal generating circuit of claim 1,
wherein the timing control unit includes:
a signal amplifier that receives the active signal to generate an amplified signal for detecting the sensing timing; and
a comparator that compares the amplified signal with a reference voltage to generate the timing control signal.

3. The sense amplifier control signal generating circuit of claim 2,
wherein the signal amplifier includes:
a first delay that delays the active signal to provide a first output signal;
an input signal generator that generates first and second input signals having different voltage levels when the active signal is enabled;
a second delay that delays the first input signal to provide a second output signal;
a third delay that delays the second input signal to provide a third output signal; and
an amplifier that amplifies potential levels of the second and third output signals in response to the first output signal and output the amplified signal.

4. The sense amplifier control signal generating circuit of claim 3,
wherein the first delay delays the active signal, to model a time between an enabling timing of the active signal and an operational starting time of the sense amplifier, and the second delay and the third delay to model a time of data transmitted from a memory cell to the sense amplifier.

5. The sense amplifier control signal generating circuit of claim 3,
wherein the input signal generator includes:
a voltage applying unit that applies a core voltage to a capacitor or outputs a voltage stored in the capacitor in response to the active signal;
a first switching unit connected to the voltage applying unit, to output a bit line pre-charge voltage in response to the active signal; and
a second switching unit that outputs a voltage obtained by adding the bit line pre-charge voltage to voltage stored in the capacitor as the first input signal in response to the active signal, and outputs the bit line pre-charge voltage as the second input signal,
wherein the bit line pre-charge voltage is a voltage of the bit line bar, and the voltage stored in the capacitor is a voltage of the bit line.

6. The sense amplifier control signal generating circuit of claim 5,
wherein the first switching unit and the second switching unit are driven at different timings in response to the active signal.

7. The sense amplifier control signal generating circuit of claim 6,
wherein each of the first and second switching units includes transistors.

8. A sense amplifier control signal generating circuit of a semiconductor memory apparatus, the sense amplifier control signal generating circuit comprising:
a timing control unit configured to model a time of data transmitted from a memory cell to a sense amplifier through a bit line, detect whether a voltage difference between a bit line and a bit line bar is a value to enable a sense amplifier and generate a timing control signal at a sensing timing when the voltage difference reaches the value; and
a sense amplifier control signal generating unit configured to receive the timing control signal to generate a sense amplifier control signal.

9. The sense amplifier control signal generating circuit of claim 8,
wherein the timing control unit includes:
a signal amplifier that receives an active signal to generate an amplified signal for detecting the sensing timing; and
a comparator that compares the amplified signal with a reference voltage to generate the timing control signal.

10. The sense amplifier control signal generating circuit of claim 9,
wherein the signal amplifier includes:
a first delay that delays the active signal to provide a first output signal;
an input signal generator that generates first and second input signals having different voltage levels when the active signal is enabled;
a second delay that delays the first input signal to provide a second output signal;
a third delay that delays the second input signal to provide a third output signal; and
an amplifier that amplifies potential levels of the second and third output signals in response to the first output signal and outputs the amplified signal.

11. The sense amplifier control signal generating circuit of claim 10,
wherein the first delay delays the active signal, to model a time between an enabling timing of the active signal and an operational starting time of the sense amplifier, and the second delay and the third delay to model a time of data transmitted from a memory cell to the sense amplifier.

* * * * *